US008117092B2

(12) United States Patent  
Farkas et al.

(10) Patent No.: US 8,117,092 B2  
(45) Date of Patent: Feb. 14, 2012

(54) INVENTORY MANAGEMENT OF COMPONENTS

(75) Inventors: Keith Istvan Farkas, San Carlos, CA (US); Parthasarathy Ranganathan, Palo Alto, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 3230 days.

(21) Appl. No.: 10/614,856

(22) Filed: Jul. 9, 2003

(65) Prior Publication Data

US 2005/0010499 A1   Jan. 13, 2005

(51) Int. Cl.  
*G06Q 10/00* (2006.01)

(52) U.S. Cl. .......................... 705/28; 235/383

(58) Field of Classification Search .................. 705/28  
See application file for complete search history.

(56) References Cited

U.S. PATENT DOCUMENTS

| 5,434,775 | A | * | 7/1995 | Sims et al. ..................... 705/8 |
| 5,546,315 | A | * | 8/1996 | Kleinschnitz ................. 700/218 |
| 2001/0020935 | A1 | * | 9/2001 | Gelbman ....................... 345/173 |
| 2003/0106937 | A1 | * | 6/2003 | Creager et al. ............... 235/384 |

* cited by examiner

*Primary Examiner* — Faris Almatrahi

(57) ABSTRACT

A system for managing inventory of components in a room. The system includes an identification device configured to communicate identification information relating to an associated component, a reader device configured to substantially autonomously receive the identification information from the identification device, and means for identifying the locations of the identification devices. The system also includes a controller configured to communicate with the reader device and compile the identification information received from the reader device and the locations of the identification devices to maintain an inventory of the components.

30 Claims, 8 Drawing Sheets

INVENTORY MANAGEMENT OF COMPONENTS

BACKGROUND OF THE INVENTION

A data center may be defined as a location, e.g., room, that houses computer systems arranged in a number of racks. A standard rack, e.g., electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Conventional data centers are known to include hundreds, if not thousands, of computer systems housed in racks. In addition, the racks may be housed in a space comprising 10,000 sq. ft. or more. Due to the size and space necessary for computing requirements in the data centers, the amount of time and expense in performing day-to-day operations by personnel in the data centers is substantial.

One such operation is to inventory the physical locations of the computer systems contained in the data centers. In conventional data centers, personnel manually create an inventory of these physical locations. In addition, the inventory must be updated frequently because the computer systems in data centers are often added, replaced or moved. The task of inventorying these components typically requires a large amount of time and manpower, especially in relatively large data centers, therefore having relatively large operating costs associated with performance of the inventory operations.

SUMMARY OF THE INVENTION

According to an embodiment, the present invention pertains to a system for managing inventory of components in a room. The system includes an identification device configured to communicate identification information relating to an associated component, a reader device configured to substantially autonomously receive the identification information from the identification device, and means for identifying the locations of the identification devices. The system also includes a controller configured to communicate with the reader device and compile the identification information received from the reader device and the locations of the identification devices to maintain an inventory of the components.

According to another embodiment, the invention relates to a method for managing inventory of components in a room. In the method, identification devices are provided and positioned in the vicinities of respective ones of the components. The identification devices are also associated with respective ones of the components. Identification information is obtained from the identification devices with a reader device configured to operate in a substantially autonomous manner and the locations of the components are determined. In addition, a correlation between the identification information and the locations of the components the correlation is stored in a memory.

According to a further embodiment, the present invention relates to a system for managing inventory in a room. The system includes means for providing identification devices; means for positioning the identification devices in the vicinities of respective ones of the components; means for associating the identification devices with respective ones of the components; means for obtaining identification information from the identification devices with a reader device configured to operate in a substantially autonomous manner; means for determining locations of the components; means for creating a correlation between the identification information and the locations of the components; and means for storing the correlation in a memory.

According to yet another embodiment, the invention relates to a computer readable storage medium on which is embedded one or more computer programs. The computer programs are configured to implement a method for managing inventory of components in a room, and includes a set of instructions for: providing identification devices; positioning the identification devices in the vicinities of respective ones of the components; associating the identification devices with respective ones of the components; obtaining identification information from the identification devices with a reader device configured to operate in a substantially autonomous manner; determining locations of the components; creating a correlation between the identification information and the locations of the components; and storing the correlation in a memory.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
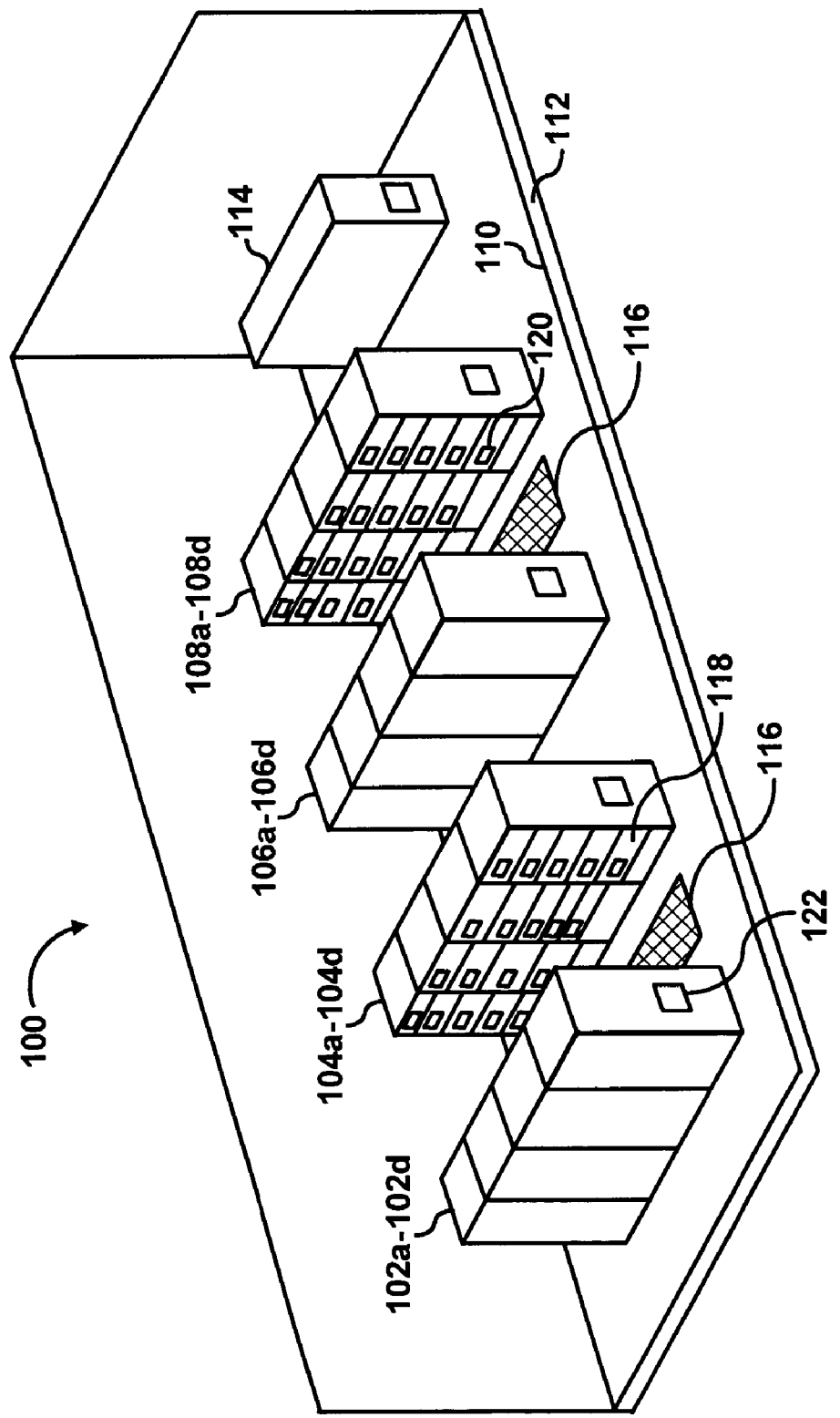
FIG. 1A shows a simplified perspective view of a room, e.g., a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated air". For purposes of simplicity, "cooling fluid" may generally be defined as air that has been cooled by a cooling device, e.g., an air conditioning unit. In addition, "heated air" may generally be defined as air, or cooling fluid, that has been heated, e.g., cooling fluid, that has received heat from a heat generating/dissipating component. It should be readily apparent, however, that the terms "cooling fluid" are not intended to denote air that only contains cooled air and that "heated air" only contains air that has been heated. Instead, embodiments of the invention may operate with air that contains a mixture of heated air and cooling fluid. In addition, cooling fluid and heated air may denote gases other than air, e.g., refrigerant and other types of gases known to those of ordinary skill in the art that may be used to cool electronic components.

According to embodiments of the invention, there is provided a management system for inventorying a plurality of components, e.g., computers, servers, disk drives, hard drives, other peripheral devices, cables, etc., located in a room, e.g., a data center. The management system may also be implemented to identify the locations of the components in the room. The components may, for example, comprise devices that are designed to be stored in racks, e.g., electronics cabinets. In addition, the racks may be positioned along aisles in the room to enable travel between the racks.

In the management system, an identification device is implemented to substantially uniquely identify the components. The identification device may take various forms without departing from the scope of the invention. In one form, the identification device may comprise a label affixed on or near the components. In another form, the identification device may comprise an electronic device with a display or other apparatus configured to enable communication between the electronic device and a reader device, e.g., through infrared communication or other wireless communication. In a further form, the identification device may comprise an apparatus configured to detect locations of the components in a certain area, e.g., a rack, an aisle of racks, a section of the room, etc., and convey this information either through a display or through other forms of communication, e.g., infrared, or other wireless communication.

The management system also includes a reader device configured to obtain identification information from the identification device. The reader device may too comprise various forms. In one form, the reader device is a scanning device configured to scan the identification device. For example, if the identification device is a barcode placed on an adhesive label, the reader device may comprise a barcode scanner. Alternatively, the identification device may comprise a camera configured to image the identification device.

In another form, the reader device may comprise an apparatus configured to wirelessly communicate with the identification device. In one regard, the reader device and the identification device may include infrared (IR) mechanisms configured to enable information to be transmitted between the devices wirelessly. In another regard, the reader device and the identification device may comprise some other forms of mechanisms configured for wireless communications therebetween.

The reader device may be positioned on a robotic vehicle configured to travel around the room. In addition, or alternatively, the reader device may be mounted on the ceiling and may be configured to be moved into various locations in the room to enable imaging of identification devices located on components positioned in the room. In any form, the reader device is configured to operate in a substantially autonomous manner. More particularly, the reader device may be operated with minimal data center personnel involvement. Thus, for example, the reader device may operate to obtain information from the identification devices without requiring data center personnel to manually traverse the data center to obtain the information. In one regard, the reader device may be operated to obtain information from the identification devices according to a pre-set routine. In another regard, the reader device may be operated to obtain information from the identification devices in response to various stimuli, e.g., when a new component is added or an existing component is moved to a different location.

The information obtained from the identification devices may be used in the creation of a chart or map to track the inventory of the components. The physical locations of the components may be stored in a memory and may be accessible via, for example, a computer. The physical locations may pertain to a coordinate location, e.g., x, y, and z axes, of the components in the room. Alternatively, the physical locations may relate to the component locations with respect to other devices in the room, e.g., the relative positioning of the components housed in racks.

According to a further embodiment of the invention, the chart or map of the component locations may be updated as conditions, e.g., locations of the components, changes in the room, change. The chart or map may be updated according to a pre-set time schedule, as conditions change, initiated in response to manual instructions by a user, etc.

With reference first to FIG. 1A, there is shown a simplified perspective view of a room, e.g., a data center 100, according to an embodiment of the invention. The terms "data center" are generally meant to denote a room or other space and are not meant to limit the invention to any specific type of room where data is communicated or processed, nor should it be construed that use of the terms "data center" limits the invention in any respect other than its definition hereinabove.

It should be readily apparent to those of ordinary skill in the art that the data center 100 depicted in FIG. 1A represents a generalized illustration and that other components may be added or existing components may be removed or modified without departing from the scope of the invention. For example, the data center 100 may include any number of racks and various other components. Thus, although the data center 100 is illustrated as containing four rows of racks 102-108, it should be understood that the data center 100 may include any number of racks, e.g., 100 racks, without departing from the scope of the invention. The depiction of four rows of racks 102-108 is thus for illustrative and simplicity of description purposes only and is not intended to limit the invention in any respect.

The data center 100 is depicted as having a plurality of racks 102-108, e.g., electronics cabinets, aligned in substantially parallel rows. The racks 102-108 are illustrated as having open front sides such that the components 118 housed therein are visible. It should, however, be understood that embodiments of the invention may be practiced with racks having panels that cover the front sides of the racks 102-108 without departing from the scope of the invention. The rows of racks 102-108 are shown as containing four racks (a-d) positioned on a raised floor 110. A plurality of wires and communication lines (not shown) may be located in a space 112 beneath the raised floor 110. The space 112 may also function as a plenum for delivery of cooling fluid from an air conditioning unit 114 to the racks 102-108. The cooling fluid may be delivered from the space 112 to the racks 102-108 through vents 116 located between some or all of the racks 102-108. The vents 116 are shown as being located between racks 102 and 104 and 106 and 108.

The racks 102-108 are generally configured to house a plurality of components 118, e.g., computers, servers, monitors, hard drives, disk drives, etc., designed to perform various operations, e.g., computing, switching, routing, displaying etc. These components 118 may comprise apparatuses (not shown), for example, processors, micro-controllers, high-speed video cards, memories, semi-conductor devices, and the like. The components 118 may therefore vary from one another, i.e., may contain different apparatuses, and may be configured to perform functions that differ from one component 118 to another component 118.

A relatively small number of components 118 are illustrated as being housed in the racks 102-108 for purposes of simplicity. It should, however, be understood that the racks 102-108 may include any number of components 118, e.g., forty or more components 118, without departing from the scope of the invention. In addition, although the racks 102-108 are illustrated as containing components 118 throughout the height of the racks 102-108, it should be understood that some or all of the racks 102-108 may include slots or areas that are not supplied with components 118 without departing from the scope of the invention.

According to an embodiment of the invention, an identification device 120 may be provided to substantially uniquely identify the components 118. As illustrated in FIG. 1A, the identification device 120 is positioned on front surfaces of the components 118. As will become more apparent from a reading of the following sections, the identification device 120 may take various forms.

Also illustrated in FIG. 1A is a plurality of labels 122. The labels 122 are generally provided to enable identification of the locations of the racks 102-108 within the data center 100. That is, for example, the racks 102-108 may be assigned a coordinate location within the data center 100. The coordinate system employed to denote the locations of the racks 102-108 may be implemented to designate the aisle and the row in which a particular rack 102-108 is situated. Thus, for example, the locations of the components 118 may be designated according to the rack designation in which the components 118 are housed.

Although the labels 122 are illustrated as being located on the sides of the racks 102a-108a, the labels 122 may be positioned at any other reasonably suitable location, e.g., the floor, the walls, the ceiling of the data center 100, without departing from the scope of the invention.

In addition or alternatively, the racks 102-108 may be assigned with a particular designation to substantially uniquely identify each of the racks 102-108. Under this scheme, the locations of the racks 102-108 may be inputted into a map or a chart (not shown) to generally enable a readily available means of identifying the locations of the racks 102-108.

Figure 1B:
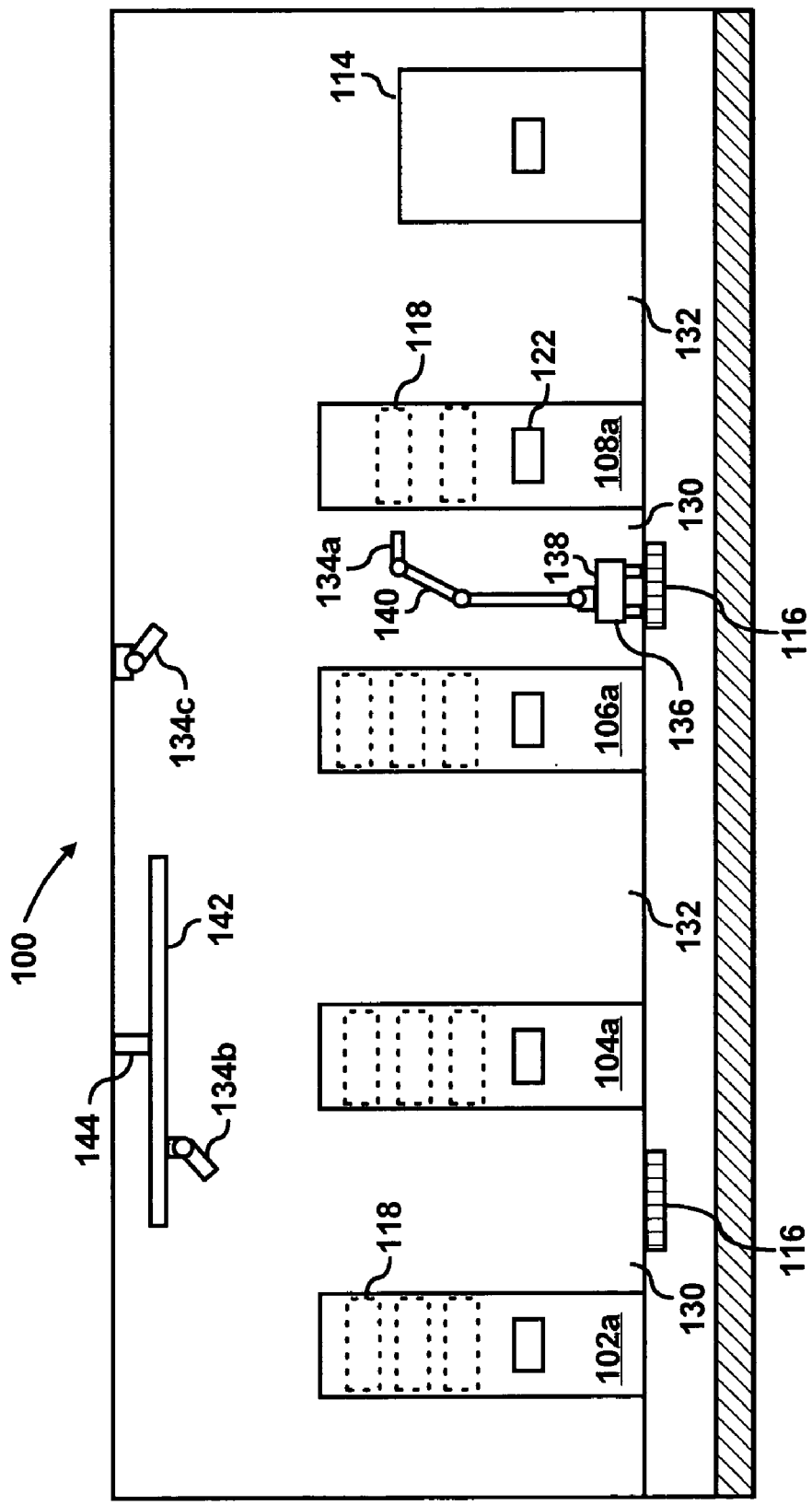
FIG. 1B shows a simplified illustration of a side elevational view of the data center shown in FIG. 1A, according to an embodiment of the invention.

With reference now to FIG. 1B, there is shown a simplified illustration of a side elevational view of the data center 100 shown in FIG. 1A, according to an embodiment of the invention. In FIG. 1B, racks 102a, 104a, 106a, and 108a are visible. In addition, some of the components 118 are visible in cross-section through the sides of the racks 102a, 104a, 106a, and 108a.

As shown in FIG. 1B, the areas between the racks 102 and 104 and between the racks 106 and 108 may comprise cool aisles 130. These aisles are considered "cool aisles" because they are configured to receive cooling fluid from the vents 116. In addition, the racks 106-108 generally receive cooling fluid from the cool aisles 130. The aisles between the racks 104 and 106, and on the rear sides of racks 102 and 108, are considered hot aisles 132. These aisles are considered "hot aisles" because they are positioned to receive air heated by the components in the racks 102-108.

The sides of the racks 102-108 that face the cool aisles 130 may be considered as the fronts of the racks 102-108 and the sides of the racks 102-108 that face away from the cool aisles 130 may be considered as the rears of the racks 102-108. For purposes of simplicity and not of limitation, this nomenclature will be relied upon throughout the present disclosure to describe the various sides of the racks 102-108.

According to another embodiment of the invention, the racks 102-108 may be positioned with their rear sides adjacent to one another (not shown). In this embodiment, vents 116 may be provided in each aisle 130 and 132. In addition, the racks 102-108 may comprise outlets on top panels thereof to enable heated air to flow out of the racks 102-108.

In any respect, the fronts of the components 118 are typically positioned to face the same direction that the fronts of the racks 102-108 face. Therefore, the identification devices 120 may be viewed from the cool aisles 130. Reader devices 134a-134c are illustrated in FIG. 1B as being positioned to image or otherwise obtain information from the identification devices 120 and/or the labels 122. As shown in FIG. 1B, the reader device 134a is situated on an arm 140 of a robotic device 136, the reader device 134b is situated on a track 142, and the reader device 134c is attached to the ceiling of the data center 100. Although three possible locations of the reader devices 134a-134c are shown in FIG. 1B, it is within the purview of the present invention that the reader devices 134a-134c may be located at various other locations of the data center 100 without departing from the scope of the invention. For example, one or more of the reader devices 134a-134c may be positioned on a wall or floor of the data center 100, on racks 102-108 or other components in the data center 100, etc. In addition, any number of reader devices positioned in any combination may be used to image the identification devices 120 without departing from the scope of the invention.

The robotic vehicle 136 may comprise a configuration and operate in manners similar to those described in co-pending and commonly assigned U.S. patent application Ser. No. 10/446,867 filed on May 29, 2003, and entitled "Data Center Robotic Device". The disclosure contained in that application is hereby incorporated by reference in its entirety. Therefore, the robotic vehicle 136 is generally composed of a vehicle base 138 having a plurality of wheels to enable travel of the robotic vehicle 136 through the data center 100. Attached to the vehicle base 138 is an arm 140 designed to rotate and be maneuvered into various positions with respect to the vehicle base 138, for example, with six or more degrees of freedom. The reader device 134a is attached to a free end of the arm 140 and is also movable with respect to the arm 140, for example, with four or more degrees of freedom.

The arm 140 and the reader device 134a may thus be maneuvered into various positions to image or otherwise obtain information from the identification devices 120 and/or the labels 122. More particularly, the reader device 134a may be positioned to obtain information from identification devices 120 located on components 118 positioned throughout the racks 102-108. In addition, the reader device 134a may obtain information from identification devices 120 associated with components that are not contained in the racks.

The reader device 134b is illustrated as being mounted on a track 142 which is attached to the ceiling of the data center 100 via a support 144. The reader device 134b may be substantially fixedly attached to the track 142. Alternatively, the reader device 134*b* may be attached in any known manner to enable the reader device 134*b* to traverse the longitudinal axis of the track 142. In addition, the reader device 134*b* may be configured to rotate into various positions with respect to the track 142, e.g., both in the plane of FIG. 1B and perpendicular to the plane of FIG. 1B. In this regard, the reader device 134*b* may be configured to obtain information from identification devices 120 located on various racks 102-108 and may also be configured to obtain information from labels 122 located at various positions in the data center 100. In addition, the track 142 may be configured to rotate about the support 144 to enable the reader device 134*b* to travel in the direction perpendicular to the plane of FIG. 1B.

The reader device 134*c* is illustrated as being supported on the ceiling of the data center 100. The reader device 134*c* may be substantially fixedly attached to the ceiling of the data center 100. Alternatively, the reader device 134*c* may be attached to the ceiling in any reasonably suitable manner to generally enable the reader device 134*c* to obtain information from a plurality of identification devices 120 of a plurality of components 118 located in the data center 100 either housed in the racks 102-108 or otherwise situated in the data center 100.

Figure 2A:
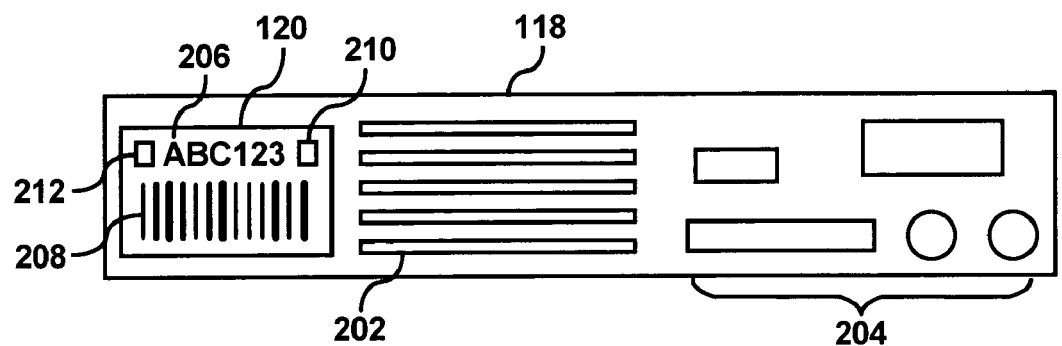
FIG. 2A illustrates a simplified front view of a component having an identification device affixed thereto according to an embodiment of the invention.

FIG. 2A illustrates a simplified front view of a component 118 having an identification device 120 affixed thereto according to an embodiment of the invention. The component 118 shown in FIG. 2A is representative of a standard rack based server. In addition, FIG. 2A represents a generalized illustration and therefore the component 118 may include additional apparatuses or existing apparatuses may be removed or modified without departing from the scope of the invention.

The component 118 illustrated in FIG. 2A includes a plurality of openings 202 to generally enable air flow through the component 118 to thereby cool heat generating/dissipating devices located therein. In addition, the component 118 is shown as including a plurality of other apparatuses 204 which generally represent, for example, switches, labels, displays, etc.

The identification device 120 illustrated in FIG. 2A generally comprises a label affixed to the front of the component 118. It should be understood that the position of the identification device 120 on the component 118 as shown in FIG. 2A is for illustrative purposes only and is not meant to limit the invention in any respect. In one regard, the identification device 120 may be positioned at a location on the component 118 that does not substantially interfere with operation of the component 118. For example, it may imprudent to position the identification device 120 over the openings 202. In addition, the location of the identification device 120 may vary from one component 118 to another based upon, for instance, the configuration of the component 118.

The identification device 120 may be affixed to the component 118 in any reasonably suitable manner known to those of ordinary skill in the art. For example, the identification device 120 may be adhered through use of adhesive, attached via mechanical fasteners (e.g., rivets, screws, nuts, bolts, etc.), welded to the component 118, and the like. In addition, the size of the identification device 120 as shown in FIG. 2A is also for illustrative purposes and may therefore comprise any reasonably suitable size without departing from the scope of the invention.

The identification device 120 is illustrated as containing a serial number 206 and a barcode 208. The serial number 206 is generally a substantially unique identifier for the component 118. In addition, the serial number 206 may be printed on the identification device 120 either manually or with a printing device to enable users to identify the component 118. The barcode 208 may also provide information regarding the identification of the component 118. The reader device 134*a*-134*c* may include a barcode reader to interpret the barcode 208. If a barcode 208 is not implemented to identify the components 118, the reader device 134*a*-134*c* may image the serial number 206 and a text recognition software may be used to identify the characters in the serial number 206.

In addition, or in the alternative, the identification device 120 may include a display, e.g., a liquid crystal display (LCD). In this instance, the serial number 206 may comprise text on the display and the barcode 208 may also be shown on the display. In addition, the identification device 120 may receive information directly from the component to which it is associated, e.g., the component's IP address, name, etc. The identification device 120 may include an input module 210 configured to receive input from a transmitter (not shown). The input module 210 may comprise an infrared port (IR) along with hardware and software associated with enabling communications through the infrared port. The transmitter may comprise, for example, a hand-held device, laptop, etc. (not shown), configured to transmit signals to the identification device 120. The communication between the transmitter and the identification device 120 may also be effectuated through a wired protocol, such as IEEE 802.3, etc., or wireless protocols, such as IEEE 801.1 b, 801.1 g, wireless serial connection, Bluetooth, etc., or combinations thereof. According to an embodiment, a user may input information pertaining to the identification of the components 118 into the identification device 120 via the transmitter.

As a further alternative, the identification device 120 may include a numeric or alpha-numeric keypad (not shown) which may be used to input the identification information for the components into the identification device 120.

The identification device 120 may include a transmitter module 212 configured to transmit the identification information to the reader device 134*a*-134*c*, e.g., an IR transmitter along with associated hardware and software. In this embodiment, the reader device 134*a*-134*c* may include a receiver module configured to receive the identification information from the identification device 120. The communication between the transmitter module 212 of the identification device 120 and the receiver module of the reader device 134*a*-134*c* may be effectuated through a wired protocol, such as IEEE 802.3, etc., or wireless protocols, such as IEEE 801.11b, 801.11g, wireless serial connection, Bluetooth, etc., or combinations thereof.

Figure 2B:
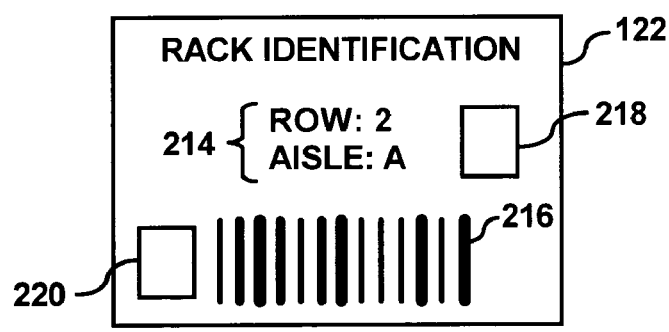
FIG. 2B illustrates a label according to an embodiment of the invention.

FIG. 2B illustrates a label 122 according to an embodiment of the invention. FIG. 2B represents a generalized illustration of a label and may therefore include additional indicia or existing indicia may be removed or modified without departing from the scope of the invention. The label 122 generally contains information pertaining to the location of, for example, a rack, e.g., racks 102-108, in a data center. The location information 214 is illustrated in the form of the row and the aisle in which the rack is located. The location information 214 may also be displayed in the form of a barcode 216 to enable the reader device 134*a*-134*c* to more readily interpret the information on the label 122.

In addition, or in the alternative, the location information 214 may be in the form of coordinate locations, e.g., x, y, and z. Thus, for example, the data center 100 may be viewed as a grid having an x-axis and a y-axis. The locations of the racks may thus be identified by their x, y coordinate designations.

The location information 214 on the label 122 may indicate the location of one rack, a plurality of racks, one or more rows of racks, etc. As stated hereinabove, the label 122 may be positioned at any reasonably suitable location in the data center 100, e.g., on one or more racks, on the floor, wall or ceiling, etc. In addition, the label 122 may be affixed to these locations in any reasonably suitable manner known to those of ordinary skill in the art. For example, the label 122 may be adhered through use of adhesive, attached via mechanical fasteners (e.g., rivets, screws, nuts, bolts, etc.), welded, and the like. In addition, the label 122 may comprise any reasonably suitable size without departing from the scope of the invention.

The indicia, e.g., location information 214, may be printed onto the label 122 manually or with a printing device. The barcode 216 may also be printed onto the label 122 with a printing device able to print barcodes. Moreover, the location information 214 and the barcode 216 may be printed on a separate media and affixed to the label 122.

In addition, or in the alternative, the label 122 may include a display, e.g., a liquid crystal display (LCD), and the location information 214 and/or the barcode 216 may comprise images on the display. The label 122 may also include an input module 218 configured to receive input from a transmitter (not shown). The input module 210 may comprise an infrared port (IR) along with hardware and software associated with enabling communications through the infrared port. The transmitter may comprise, for example, a hand-held device, laptop, etc., configured to transmit signals to the label 122. The communication between the transmitter and the label 122 may be effectuated through a wired protocol, such as IEEE 802.3, etc., or wireless protocols, such as IEEE 801.11b, 801.11g, wireless serial connection, Bluetooth, etc., or combinations thereof. According to an embodiment, a user may input information pertaining to the locations of the racks into the label 122 via the transmitter.

As a further alternative, the label 122 may include a numeric or alpha-numeric keypad (not shown) which may be used to input the location information 214 for the racks into the label 122.

The label 122 may include a transmitter module 216 configured to transmit the identification information 214 to, for instance, the reader device 134a-134c, e.g., an IR transmitter along with associated hardware and software. In this embodiment, the reader device 134a-134c may include a receiver module configured to receive the location information 160 from the label 122. The communication between the transmitter module of the label 122 and the receiver module of the reader device 134a-134c may be effectuated through a wired protocol, such as IEEE 802.3, etc., or wireless protocols, such as IEEE 801.11b, 801.11g, wireless serial connection, Bluetooth, etc., or combinations thereof.

In both the identification device 120 and the label 122, the indicia 206 and 214 may be included thereon to enable a user to easily identify the serial number 206 of the component and the location information of the rack. It should, however, be understood by one or ordinary skill in the art that the indicia 206 and 214 may be omitted without departing from the scope of the invention.

One or both of the identification device 120 and the label 122 may comprise characteristics that generally enable a software to substantially easily identify the identification device 120 and/or the label 122. For instance, the identification device 120 and/or the label 122 may comprise a color, border, reflective properties, etc., with which the software may be programmed to identify. Therefore, the reader devices 134a-134c may more readily determine the locations of the identification devices 120 and/or the labels 122.

Figure 3A:
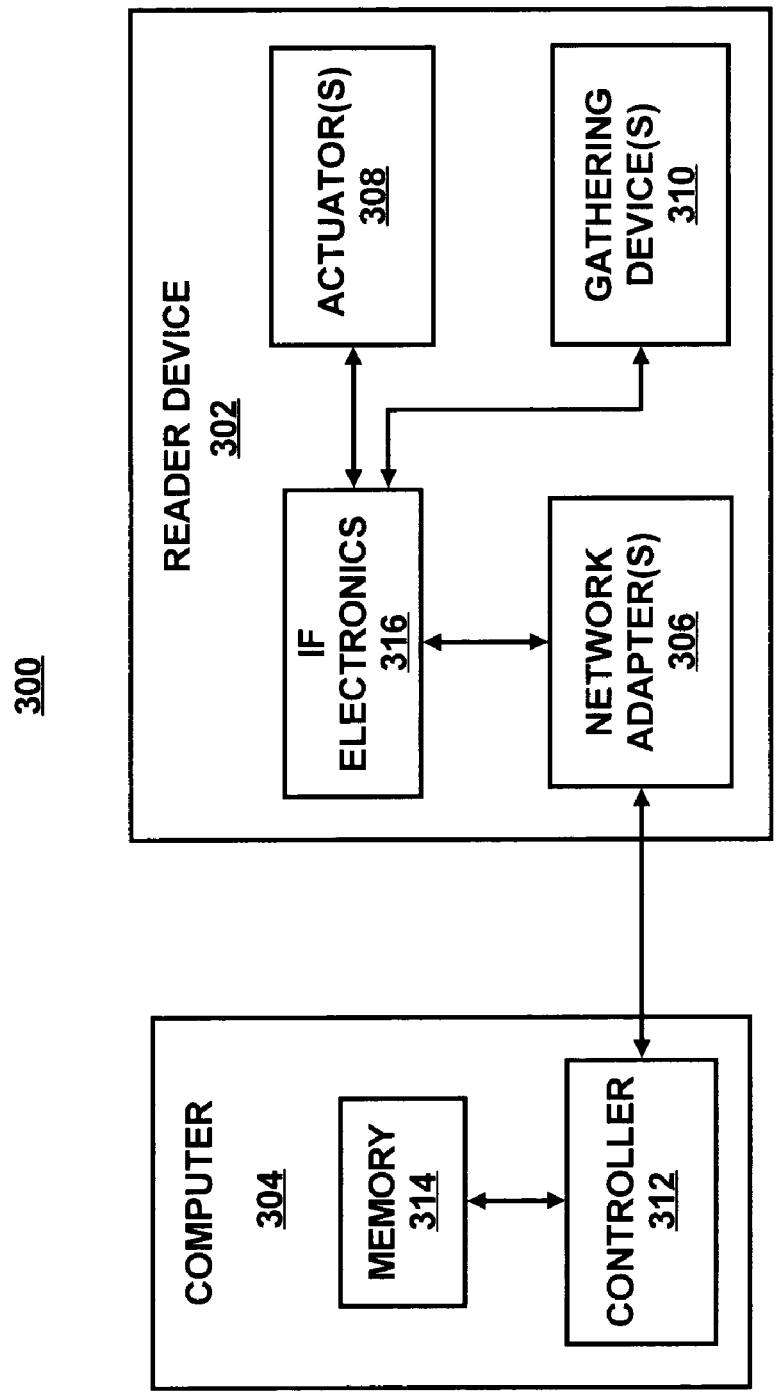
FIG. 3A is an exemplary block diagram for a reader device and a computer according to an embodiment of the invention.

FIG. 3A is an exemplary block diagram 300 for a reader device 302 and a computer 304 according to an embodiment of the invention. It should be understood that the following description of the block diagram 300 is but one manner of a variety of different manners in which such a reader device 302 and computer 304 may be configured. In addition, it should be understood that the reader device 302 and the computer 304 may each include additional components and that some of the components described may be removed and/or modified without departing from the scope of the invention.

The reader device 302 is interfaced with the computer 304 via one or more network adapter(s) 306. The network adapter(s) 306 may be configured to enable wired or wireless communication between the computer 304 and the reader device 302. In one regard, the reader device 302 may receive instructions from the computer 304 and may also transmit images or other data to the computer 304. More particularly, in the embodiment illustrated in FIG. 3A, the reader device 302 may receive operational instructions from the computer 304. That is, for example, the computer 304 may instruct the reader device 302 to position itself to obtain images or data from various sections of the data center.

The instructions may be received through the network adapter(s) 306 and implemented through one or more actuators 308, e.g., direct current (DC) motors, and the like, configured to manipulate the position of the reader device 302. For instance, with respect to the reader devices 134b and 134c illustrated in FIG. B, the actuator(s) 308 may articulate the reader devices 134b and 134c to face various directions in the data center 100. In addition, the actuator(s) 308 may position the reader device 134b into various locations with respect to the track 142.

The reader device 302 may transmit or otherwise send the obtained images or data to the computer 304. The images or data may be obtained through one or more gathering devices 310. The gathering device(s) 310 may comprise any suitable device configured to gather information from the identification device 120 and/or the label 122. In this regard, the gathering device(s) 310 may comprise a camera configured to image the identification device 120 and the label 122, a receiver for receiving data/information from the identification device 120 and the label 122, combinations thereof, etc.

The computer 304 is illustrated as containing a controller 312 and a memory 314. The controller 312 is configured to control the operations of the reader device 302. As stated hereinabove, the controller 312 may control operations of the actuator(s) 308 and the gathering device(s) 310. The controller 312 may thus comprise a microprocessor, a micro-controller, an application specific integrated circuit (ASIC), and the like.

The instructions from the controller 312 may also be sent through interface electronics 316. The interface electronics 316 may be provided to act as an interface between the controller 312 and the actuator(s) 308 and the gathering device(s) 310. By way of example, the interface electronics 316 may vary the voltage supplied to the actuator(s) 308 to thereby articulate the reader device 302.

The controller 312 may also be interfaced with the memory 314. The memory 314 may be configured to provide storage of a computer software that provides the functionality of the reader device 302 and the computer 304. The memory 314 may be implemented as a combination of volatile and non-volatile memory, such as DRAM, EEPROM, flash memory, and the like. The memory 314 may also be configured to provide a storage for containing data/information pertaining to the manner in which the actuator(s) 308 may be manipulated in response to, for example, an instruction to obtain information from one or more identification devices 120.

In one respect, the memory 314 may store data/information pertaining to timing operations and information gathering algorithms responsive to various input. The controller 312 may operate the actuator(s) 308 in manners relative to the data/information stored in the memory 314 in response to the input. In another respect, the memory 314 may store the images and/or information pertaining to the data received from the reader device 302. For instance, the memory 314 may store the serial numbers of the components 118 along with their associated locations in the data center 100. In addition, the memory 314 may contain correlation between the serial numbers and the configurations of their associated components.

Although the computer 304 is illustrated as communicating with a single reader device 302, it is within the purview of the invention that the computer 304 may send instructions to and receive information from a plurality reader devices 302 without departing from the scope of the invention.

According to an embodiment of the invention, communication between the computer 304 and the reader device 302 may be effectuated through location aware devices as described in co-pending and commonly assigned U.S. patent application Ser. No. 10/620,272, filed on Jul. 9, 2003, entitled "LOCATION AWARE DEVICES", the disclosure of which is hereby incorporated by reference in its entirety. As described in that application, these devices are termed "location aware" because they are operable to determine their general locations with respect to other sensors and/or devices and to communicate with one another through wireless communications.

Although the reader device 302 and the computer 304 have been illustrated as two separate components in FIG. 3A, it should be understood that the reader device 302 and the computer 304 may be formed as a single component without departing from the scope of the invention. In this regard, the reader device 302 may have a controller and a memory configured to control its operation.

Figure 3B:
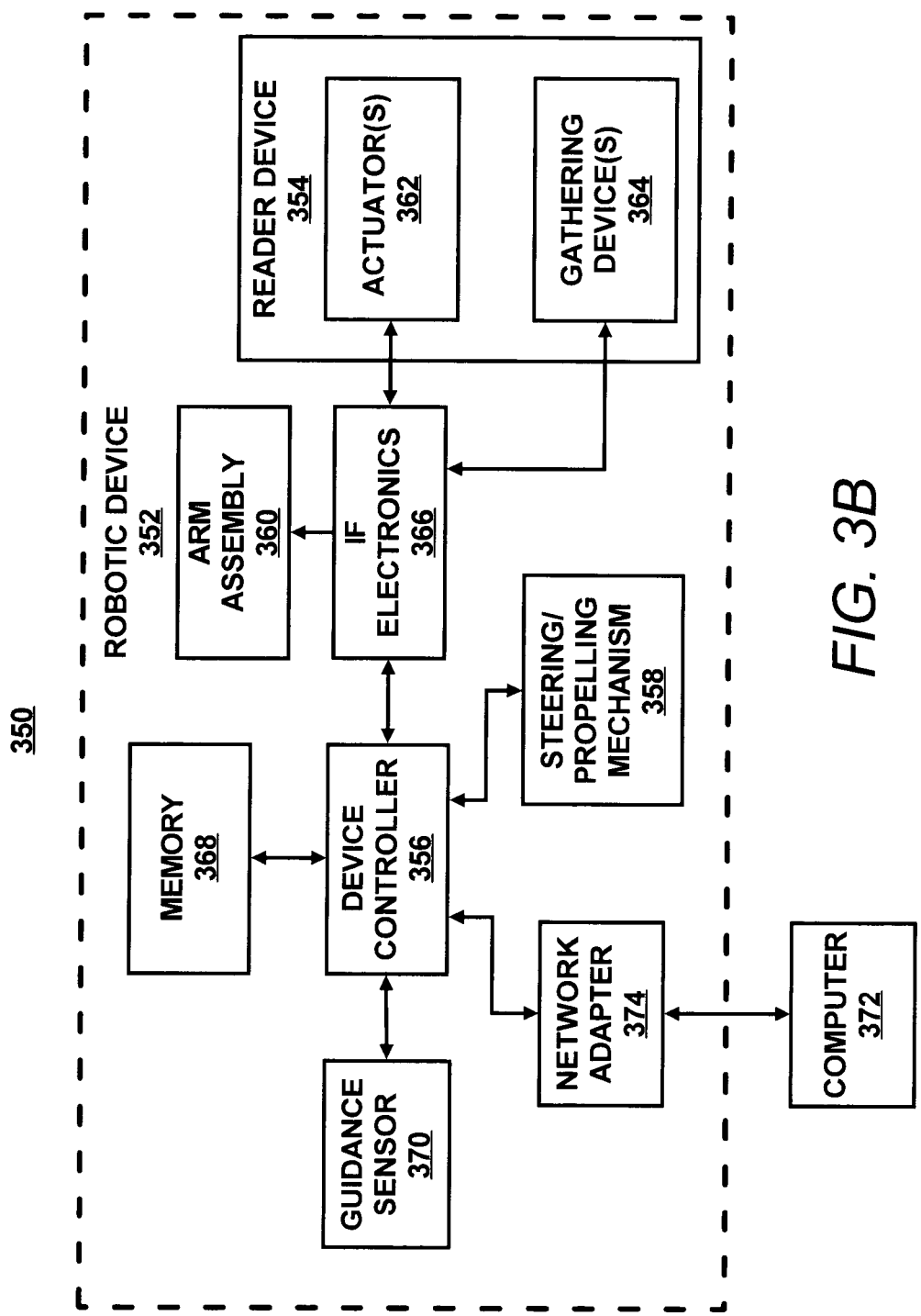
FIG. 3B is an exemplary block diagram for a robotic device having a reader device according to an embodiment of the invention.

FIG. 3B is an exemplary block diagram 350 for a robotic device 352 having a reader device 354 according to an embodiment of the invention. It should be understood that the following description of the block diagram 350 is but one manner of a variety of different manners in which such a robotic device 352 and reader device 354 may be configured. In addition, it should be understood that the robotic device 352 and the reader device 354 may include additional components and that some of the components described may be removed and/or modified without departing from the scope of the invention.

The robotic device 352 may comprise the configuration of the robotic device 136 and the reader device 354 may comprise the configuration of the reader device 134a illustrated in FIG. 1B. Thus, the robotic device 352 may include an arm assembly 360 along with associated actuators configured to maneuver the arm assembly 360 into various positions.

The robotic device 352 includes a device controller 356 configured to control the operations of the robotic device 352. By way of example, the device controller 356 may control the reader device 354, a steering/propelling mechanism 358, and an arm assembly 360. The device controller 356 may thus comprise a microprocessor, a micro-controller, an application specific integrated circuit (ASIC), and the like.

The arm assembly 360 may comprise actuators configured to manipulate the arm assembly into various positions. The reader device 354 may be positioned near a free end of the arm assembly 360 and its position may be varied through movement of the arm assembly 360. In one regard, the position of the reader device 354 may be varied to enable the reader device to image or communicate with identification devices 120 and labels 122 located at various locations of the data center 100.

The reader device 354 may also include one or more actuators 362 for articulating the reader device 354 with respect to the robotic device 352. The actuators of the arm assembly 360 and the actuator(s) 362 of the reader device 354 may comprise direct current (DC) motors.

The reader device 354 may contain one or more gathering devices 364 for gathering information from the identification devices 120 and/or the labels 122. In this regard, the gathering device(s) 354 may comprise a camera configured to image the identification device 120 and the label 122, a receiver for receiving data/information from the identification device 20 and the label 122, combinations thereof, etc. The information obtained by the gathering device(s) 354 may be transmitted or otherwise sent to the device controller 356.

The instructions from the device controller 356 may also be sent through interface electronics 366. The interface electronics 366 may be provided to act as an interface between the controller 354 and the actuator(s) 362 and the gathering device(s) 364. By way of example, the interface electronics 316 may vary the voltage supplied to the arm assembly 360 to thereby articulate of the reader device 352 into various positions.

The steering/propelling mechanism 358 may be configured to control the motivation and direction of travel for the robotic device 352. The steering/propelling mechanism 352 may thus comprise actuators configured to vary these aspects of the robotic device 352 travel.

The device controller 356 may also be interfaced with a memory 368 configured to provide storage of a computer software that provides the functionality of the robotic device 352 and the reader device 354. The memory 368 may be implemented as a combination of volatile and non-volatile memory, such as DRAM, EEPROM, flash memory, and the like. The memory 368 may also be configured to provide a storage for containing data/information pertaining to the manner in which the arm assembly 360 and the actuator(s) 362 may be manipulated in response to, for example, an instruction to obtain information from one or more identification devices 120.

In one respect, the memory 368 may store data/information pertaining to various operations and information gathering algorithms responsive to various inputs. For example, the device controller 356 may operate the robotic device 352 to travel to various areas of the data center 100 in response to input received instructing the robotic device 352 to obtain information from identification devices 120 located in those various areas. The input may be an instruction received from a user, based upon an elapsed time, etc. According to an embodiment, the memory 368 may store the location information for the identification devices 120, e.g., as a map, coordinate locations, etc.

In addition, the device controller 356 may access the memory 368 to determine manners in which the reader device 354 is to be operated in response to receipt of various inputs. For example, the device controller 356 may operate the reader device 354 to obtain information from one or more identification devices 120 by actuating the reader device 354 to be in position to obtain information from the one or more identification devices 120. Moreover, the memory 368 may contain an algorithm configured to control operation of the gathering device(s) 364 when the reader device 354 is positioned to obtain information from the one or more identification devices 120.

The reader device 354 may also transmit or otherwise send the information obtained from the identification device 120 and/or the label 122 to the device controller 356. The device controller 356 may store this information in the memory 368. For instance, the memory 368 may store the serial numbers of the components 118 along with their associated locations in the data center 100. In addition, the memory 368 may contain a correlation between the serial numbers and the configurations of their associated components 118.

The device controller 356 may also receive information from a guidance sensor 370, e.g., a laser guidance tool, sonar tool, a camera assembly, combinations thereof, and the like, configured to detect the distances of objects located within the field of view of the guidance sensor 370. The received information may be in the form of detected locations of objects located around the robotic device 352. The information obtained by the guidance sensor 370 may be transmitted or otherwise sent to a user who may operate the robotic device 352 to avoid, for example, objects located in the path of the robotic device 352. In addition, or as an alternative, the device controller 356 may process the images, e.g., with image recognition software. In this regard, the device controller 356 may determine the objects located within the guidance sensor's 370 field of view, whether the object is an avoidable obstacle, and determine a path around the obstacle if it is avoidable.

The device controller 356 may communicate with a computer 372 via a network adapter 374. The computer 372 may comprise the configuration of the computer 304 illustrated in FIG. 3A. The network adapter 374 may be configured to enable wired or wireless communication between the device controller 356 and the computer 372. In one regard, the device controller 356 may receive instructions from the computer 372 and may also transmit images or other data to the computer 372.

In addition, a user may implement the computer 372 to control the operations of the robotic device 352. For instance, a user may control the travel of the robotic device 356 as well as the arm assembly 360, and the reader device 354 by sending instructions to the device controller 356 via the computer 372. Moreover, the computer 372 may receive the information obtained by the gathering device(s) 364 and store this information in its memory.

Although a single robotic device 352 and a single reader device 354 are illustrated in FIG. 3B as communicating with the computer 372, it should be understood that a plurality of robotic devices 352 and reader devices 354 may communicate with the computer 372 without departing from the scope of the invention. In one regard, the computer 372 may receive information from a plurality of reader devices 354, either located on robotic devices 352 or otherwise situated in the data center 100. In this instance, the reader devices 354 may substantially concurrently obtain information from identification devices 120 and labels 122 located in various sections of the data center 100. The computer 372 may compile the received information in a readily accessible form such that the components 118 housed in the data center 100 along with their respective locations may be readily identified.

According to an embodiment of the invention, and as described hereinabove with respect to co-pending U.S. patent application Ser. No. 10/620,272, the robotic device 352 may include a location aware device. In addition, location aware devices may be positioned at various locations of the data center 100. Through use of location aware devices as described in that application, the device controller 356 may determine its location with respect to the other location aware devices. In addition, the device controller 356 may wirelessly receive information from the other location aware devices. Thus, for example, the identification information of the components may be wirelessly transmitted to the robotic device 352.

Figure 4A:
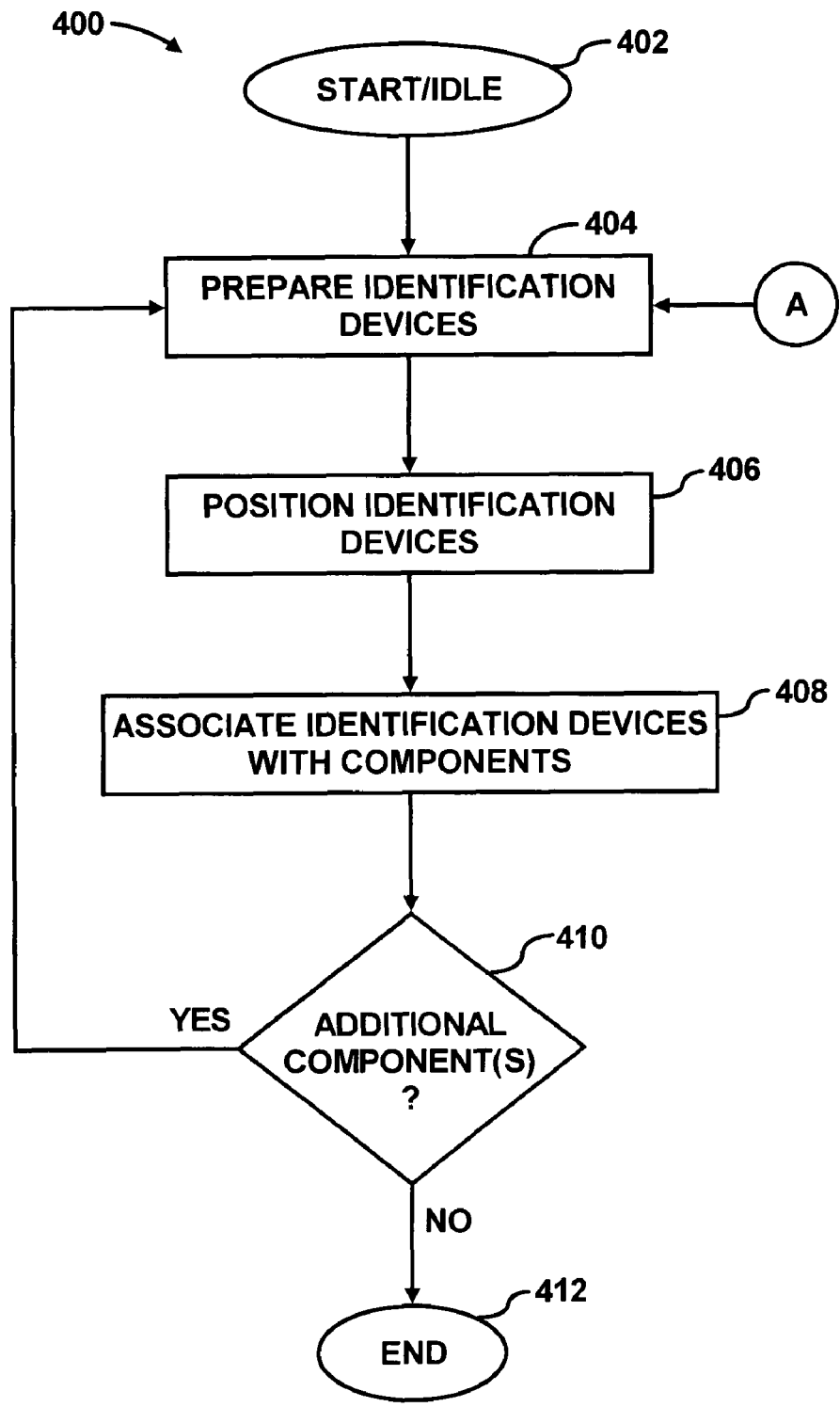
FIGS. 4A and 4B, collectively, illustrate an exemplary flow diagram of an operational mode of an inventory management system according to an embodiment of the invention.
Figure 4B:
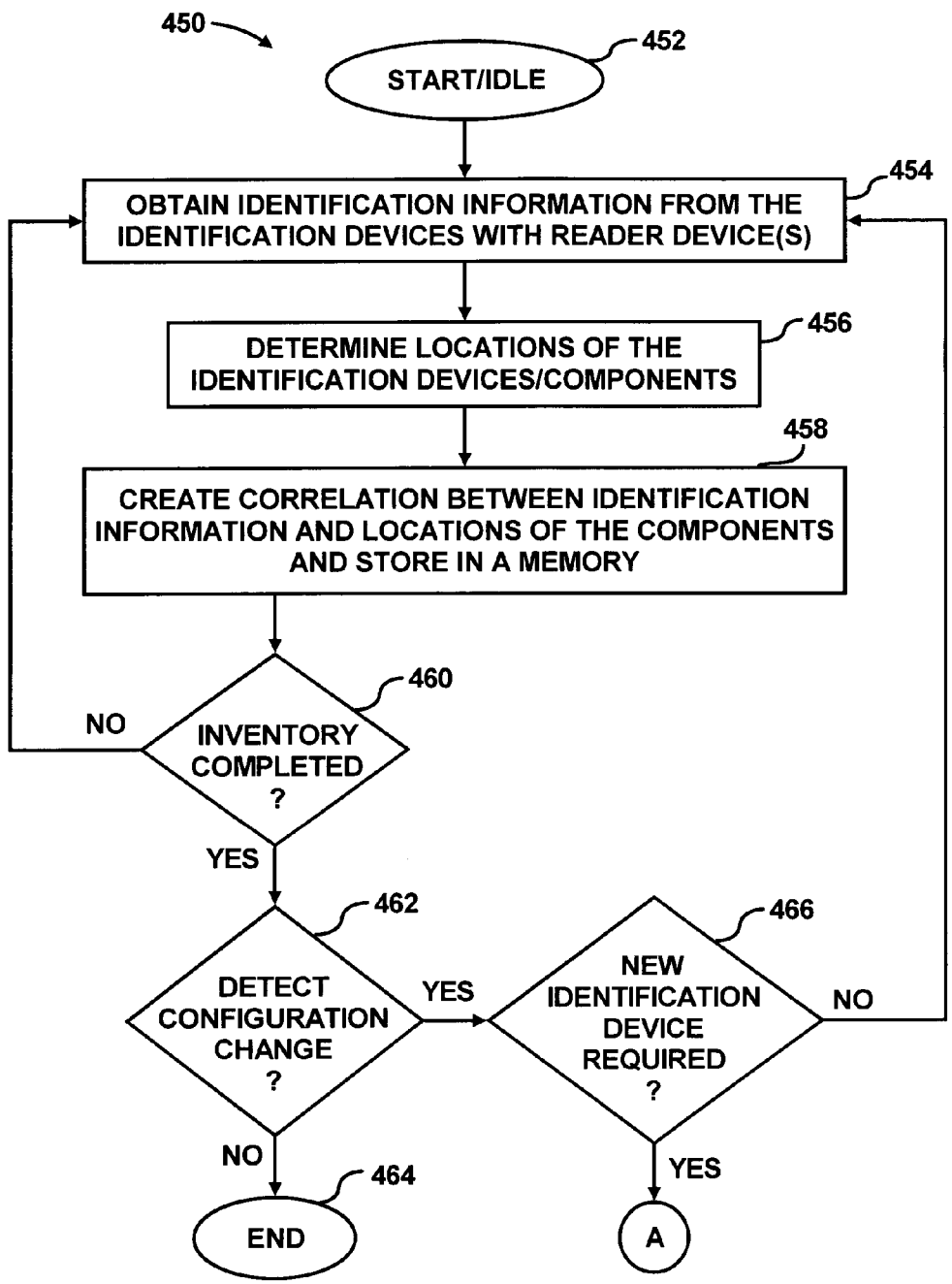

FIGS. 4A and 4B, collectively, illustrate an exemplary flow diagram of an operational mode 400 and 450 of an inventory management system according to an embodiment of the invention. It is to be understood that the following description of the operational modes 400 and 450 are but one manner of a variety of different manners in which an embodiment of the invention may be operated. It should also be apparent to those of ordinary skill in the art that the operational modes 400 and 450 represent a generalized illustration and that other steps may be added or existing steps may be removed, modified or rearranged without departing from the scope of the invention. The description of the operational modes 400 and 450 are made with reference to the block diagrams 300 and 350 illustrated in FIGS. 3A and 3B, respectively, and thus makes reference to the elements cited therein. It should, however, be understood that the operational modes 400 are not limited to the elements set forth in the block diagrams 300 and 350.

With reference first to FIG. 4A, there is illustrated an operational mode 400 for labeling components in the data center. The operational mode 400 may be initiated in response to a variety of stimuli at step 402. For example, the operational mode 400 may be initiated in response to a predetermined lapse of time, in response to receipt of a transmitted signal, manually initiated, etc.

At step 404, identification devices, e.g., identification devices 120, may be prepared by associating components, e.g., components 118, in the data center with identifying information. The identifying information may comprise a serial number or other form of distinguishing the various components from each other. As described hereinabove with respect to FIG. 2A, the identification devices may take various forms. For instance, the identification devices may comprise labels with identifying indicia placed thereon. The identifying indicia may comprise text and/or a barcode. In addition, the identifying indicia may substantially uniquely identify the component, e.g., component 118, to which the identification device is associated.

As another example, the identification devices may comprise electronic devices configured to receive identifying information. The identifying information may be received, for example, either through manual input by a user or through communication with another electronic device, e.g., a PDA. The identification devices of this type may also display or otherwise transmit the identifying information to, for example, a reader device, e.g., reader devices 134a-134c.

At step 406, the identification devices may be positioned near respective ones of the components. For instance, as illustrated in FIG. 1A, the identification devices may be positioned on front panels of the components 118. The identification devices may also be positioned in the vicinities of the components 118, e.g., on a front, side, rear, or top panel of a rack.

In addition, if the identification devices have not been associated with their respective components at step 404, they may be associated with their respective components at step 408. That is, identifying information pertaining to the associated components may be either placed, e.g., written, printed, etc., or inputted into the identification devices.

At step 410, it may be determined whether one or more components have been added to the data center. A user may determine whether additional component(s) have been added in the data center, e.g., the person who installed the additional component(s). If it is determined that additional component(s) have been installed in the data center, steps 404-408 may be repeated for those additional component(s).

Alternatively, if no additional component(s) are determined to have been installed in the data center, the operational mode 400 may end as indicated at step 412. Step 412 may be equivalent to an idle mode since steps 404-410 may be repeated when a new component is installed into the data center.

According to an embodiment of the invention, data center personnel may perform the operational mode 400. In addition, or alternatively, a robotic device may be implemented to perform the operational mode 400. For example, the robotic device may be programmed to prepare, attach and associate the identification devices with respective ones of the components. In this regard, the robotic device may be programmed to traverse the data center and position the identification devices according to their designated locations.

With reference now to FIG. 4B, there is illustrated an operational mode 450 for reading and inventorying the components in the data center based upon information obtained from the identification devices implemented in the operational mode 400. The operational mode 450 may be initiated in response to a variety of stimuli at step 452. For example, the operational mode 450 may be initiated in response to a predetermined lapse of time, in response to receipt of a transmitted signal, manually initiated, etc.

One or more reader devices, e.g., reader devices 134a-134c, may obtain the identification information from the identification devices at step 452. In addition, or in the alternative, the identification information may be stored, e.g., in the memory 314, 368, or in the computer 372, substantially concurrently with the positioning of the identification devices at step 406. In this regard, for example, an operator or user in the data center may track the identification information for the identification devices as they are being placed or programmed.

In the event that the identification devices comprise labels with identifying indicia placed thereon, the identifying indicia may be imaged by the one or more reader devices. For instance, if the identifying indicia comprises text, the text may be imaged and processed by an image recognition software capable of interpreting the text or it may be interpreted by a user. As another example, if the identification devices comprise electronic devices as described hereinabove, the identifying information may be received by the one or more reader devices. The communication between the identification devices and the reader devices may be effectuated through wired protocols, such as IEEE 802.3, etc., or wireless protocols, such as IEEE 801.11b, is 801.11g, wireless serial connection, Bluetooth, etc., or combinations thereof.

If the reader device comprises the reader devices 134b and/or 134c illustrated in FIG. 1B, the reader device may be articulated into position to obtain the identifying information from the identification devices. As set forth above, articulation of the reader device may comprise adjusting the angle of the reader device and/or re-positioning the reader device on a track.

If the reader device is positioned on a robotic device, e.g., robotic device 352, the robotic device may be configured to travel through data center to obtain the identification information from the identification devices. The route that the robotic device follows may be predetermined and stored in the memory 368. In addition, or alternatively, a user may control the operation of the robotic device through, e.g., the computer 372. The route may be selected according to the locations of the identification devices where the identification information is to be obtained. Thus, for example, if all of the components in a data center are newly added, the robotic device may follow a route that causes the robotic device to travel through almost the entirety of the data center. Also, if a few components are replaced, moved, or removed, the robotic device may be configured to travel to the locations of those components. In addition, the path of the robotic device may be chosen such that the travel time is minimized or the path may comprise a substantially unimpeded path.

At step 456, the locations of the identification devices and therefore the components to which they are associated, are determined. According to an embodiment, markers or labels, e.g., labels 122, designating various locations of the data center may be positioned to identify locations of the data center. In this respect, through use of the markers or labels, the locations of the components, and more particularly the racks in which they are located, may be determined. The locations of the components within the racks may also be determined at step 456.

In one regard, the component locations within the racks may be determined through their respective positioning in the racks. For example, the reader devices may determine the relative ordering of the components through determination of the ordering of the identification devices, e.g., the relative heights of the identification devices. As another example, the rack sizes may be programmed into the controller 312, 356 and the controller 312, 356 may determine whether any empty spaces or slots are present in the racks.

According to another embodiment, the component locations may be determined through determination of the robotic device 352 location. The location of the robotic device may be determined through various means. For instance, the robotic device 352 may include a map of the data center layout in its memory 368. The robotic device 352 may access the map to determine its location and the locations of the components. As another example, one or more cameras (not shown) may be positioned in the data center and may be configured to track the location of the robotic device 352. As a further example, location aware devices may be implemented to determine the location of the robotic device 352. As a yet further example, global positioning system devices may be implemented on the robotic device 352 to enable it to track its location.

According to another embodiment of the invention, the racks may contain controllers configured to communicate with the components housed therein. The controllers may receive information pertaining to the identities of the components, e.g., IP addresses, names, etc. The controllers may also be configured to determine the locations of the components housed therein and display or transmit the identification information and/or location information of the components to one or more reader devices. In this regard, these controllers may function in manners similar to the identification devices described hereinabove.

In one respect, the controllers may comprise the location aware devices described hereinabove. The controllers may thus be configured to determine their locations with respect to each other and with respect to a fixed reference point to determine their locations within the data center. In addition, the controllers may be configured to communicate with, for example, the robotic device to transmit the identifying and location information of the components to the robotic device.

At step 458, a correlation between the identifying information obtained from the identification devices and their respective locations may be created. In addition, the contents of the components, e.g., type and/or number of processors contained in the components, memory capacity, disk drive capacity, etc., may also be cataloged with the component identifications and locations and stored in a memory. The locations of the racks and components may be stored in any reasonably suitable form, e.g., graphically in two or three dimensions, Table 1 below, etc.

TABLE 1

| Rack Serial No. | Location (row, col.) | Rack Sp. 1 Ser. No. | Rack Sp. 2 Ser. No. | Rack Sp. 3 Ser. No. | ... | Rack Sp. N Ser. No. |
|---|---|---|---|---|---|---|
| Abc123 | 1, 1 | Abcd12 | Abce13 | Empty | ... | Acde14 |
| Def456 | 1, 2 | Cdes34 | Empty | Ghdi53 | ... | Empty |
| Ghsi432 | 1, 3 | Dioe86 | Chid52 | Clwh93 | ... | Cisl948 |
| Ghei58 | 1, 4 | Fkhi94 | Slej23 | Ghei48 | ... | Empty |
| Hceh439 | 2, 1 | Ghgh49 | Erue48 | Cghe943 | ... | Bhek74 |

As seen in Table 1, the racks have been assigned serial numbers as a means of identifying the racks. In addition, the components have also been assigned serial numbers. The racks have also been identified as containing spaces (Sp.). Thus, for example, the component having the serial number "Abcd12" is located in the rack having the serial number "Abc123" and is located in space 1 of the rack. The spaces identified in Table 1 may generally correlate to the heights of the spaces in the racks. Thus, space 1 may designate the lowest space in the racks and space N may designate the highest space in the racks.

The serial numbers for the racks and the components are listed in alphanumeric text. It should, however, be understood that the serial numbers of the racks may comprise any reasonably suitable manner of identifying the racks and the components. For example, numerals, letters, names, symbols, and the like, may be used to identify the racks and the components.

Table 1 may also include information pertaining to the contents of the components housed in the racks (not shown). Alternatively, another table may be used to correlate this relationship between the serial numbers of the components and their respective contents.

According to another embodiment of the invention, the locations of the components may be tracked according to their respective heights from a reference location, e.g., the floor of the data center. In this regard, by knowing the heights of the racks, the relative locations of the components within the racks may be determined. As a further alternative, the locations of the components may be tracked according to their coordinate locations, e.g., in the x, y, and z-axes, within the data center.

At step 460, it may be determined whether all of the intended components have been inventoried. If additional components remain to be inventoried, steps 454-458 may be repeated to inventory those components. If it is determined that all of the intended components have been inventoried, it may be determined whether a configuration change, e.g., existing components have been modified, moved or removed, new components have been added, etc., has occurred in the data center at step 462. This determination may be made in a variety of manners. As an example, personnel in the data center may manually detect a change when they perform the modification. A configuration change may also be detected through receipt of information by a reader device. For example, a reader device may detect that the location of an identification device has changed or a new identification device has been added.

If a configuration change is not detected, the operational mode 450 may end as indicated at step 464. Step 464 may be equivalent to an idle state, e.g., step 452, and thus may remain in the idle state until it is reinitiated. As stated hereinabove, the operational mode 450 may be reinitiated after a predetermined lapse of time, manually reinitiated, in response to detected configuration changes in the data center, etc.

In any event, it may be determined whether a new identification device is required at step 466 in response to a detected configuration change. Again, this determination may be made by data center personnel or through information acquired by a reader device. In the latter case, the reader device may detect that a previously empty slot now contains a component that does not have an associated identification device. If a new identification device is required, it may be prepared at step 404 and steps 406-412 may be repeated. If a new identification device is not required, or following implementation of steps 404-412 in response to a new identification device being required, the information from the identification device may be obtained at step 454 and steps 456-464 may be repeated.

The operations set forth in the operational mode 450 may be contained as a utility, program, or a subprogram, in any desired computer accessible medium. In addition, the operational mode 450 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
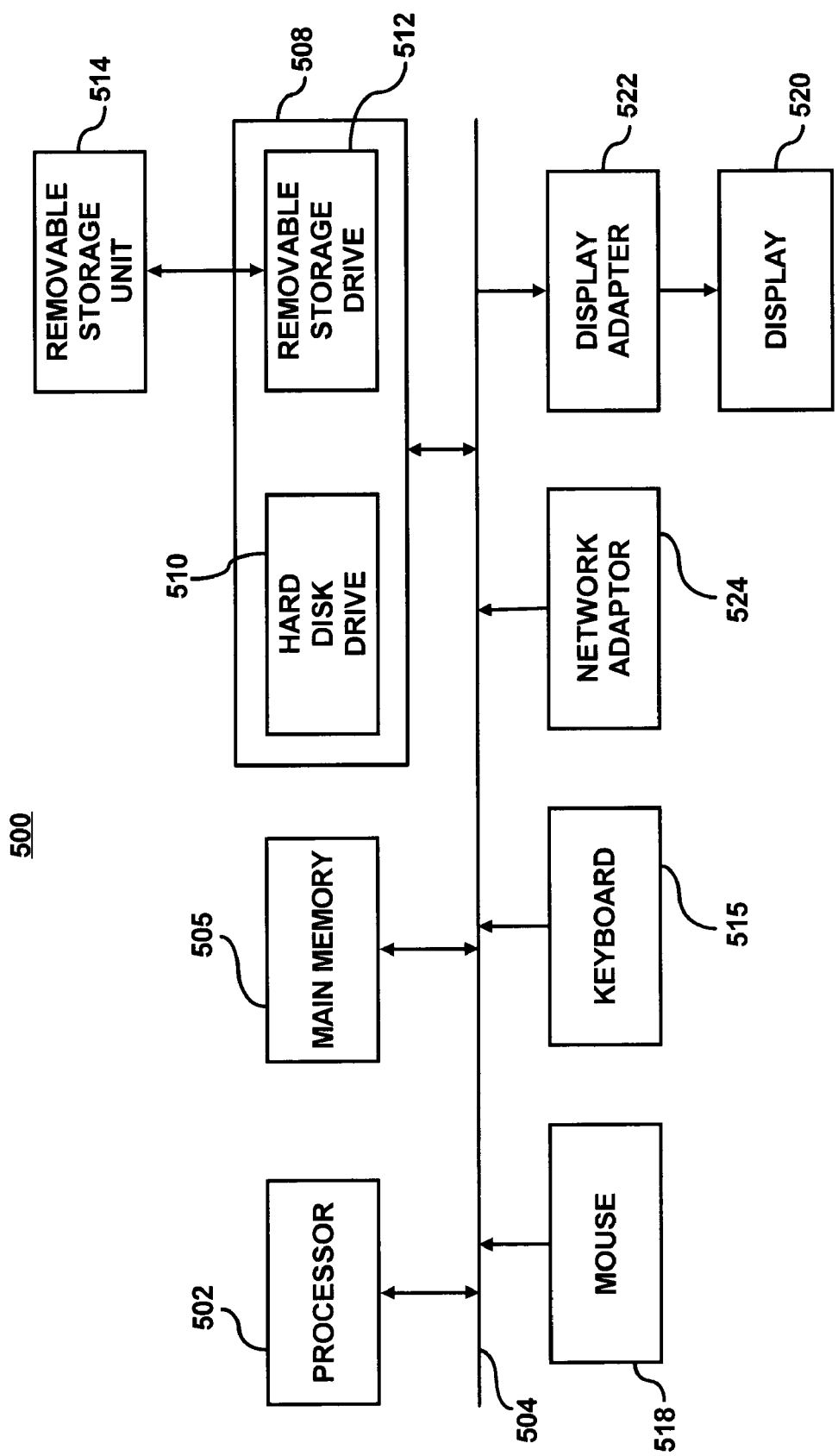
FIG. 5 illustrates an exemplary computer system 500, according to an embodiment of the invention.

FIG. 5 illustrates an exemplary computer system 500, according to an embodiment of the invention. The computer system 500 may include the computer 304, the device controller 356, and/or the computer 372. In this respect, the computer system 500 may be used as a platform for executing one or more of the functions described hereinabove with respect to the computer 304, device controller 356, and/or the computer 372.

The computer system 500 includes one or more controllers, such as a processor 502. The processor 502 may be used to execute some or all of the steps described in the operational mode 400. Commands and data from the processor 502 are communicated over a communication bus 504. The computer system 500 also includes a main memory 506, e.g., memory 314 and/or 368, such as a random access memory (RAM), where the program code for the reader device 302, 354 may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the provisioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, e.g., the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (e.g., user input devices, secondary memory, etc.).

By virtue of certain embodiments of the present invention, the costs associated with operating a data center may be substantially reduced. In one respect, by substantially automating activities that may be performed by personnel in the data center, the associated costs as well as the time and manpower involved in performing these activities may be reduced. More particularly, the inventory management system according the present invention generally enables inventory control and tracking of components in a data center without requiring the level of personnel intervention faced with known inventory tracking systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for managing inventory of components in a room, said system comprising:
a plurality of identification devices affixed to respective associated components, said plurality of identification devices being configured to communicate identification information relating to the respective associated components and comprising respective digital displays configured to display the identification information;
a reader device configured to substantially autonomously receive the identification information from the identification devices;
means for identifying locations of the identification devices from the identification information received by the reader device from the plurality of identification devices; and
a controller configured to communicate with the reader device and compile the identification information received from the reader device and to communicate with the means for identifying the locations of the identification devices to maintain an inventory of the components and their respective locations.

2. The system according to claim 1, further comprising:
a memory accessible by said controller, wherein said controller is configured to store the identification information and the locations of the identification devices in the memory.

3. The system according to claim 1, wherein the components comprise electronic devices for use in data centers.

4. The system according to claim 1, wherein the identification devices comprise labels affixable to the components, said labels having identifying indicia displayed thereon.

5. The system according to claim 4, wherein the identifying indicia comprises at least one of text, barcode, or a display on a screen.

6. The system according to claim 1, wherein the identification devices comprise relatively distinctive identifying characteristics, said characteristics comprising at least one of color, composition, and style.

7. The system according to claim 1, further comprising:
a data transmitting device configured to transmit data to the identification devices; and
wherein the identification devices comprise electronic apparatuses configured to receive data from the data transmitting device.

8. The system according to claim 1, wherein the reader device comprises at least one of an imaging device, an infrared reader, and an apparatus configured to wirelessly communicate with the identification devices.

9. The system according to claim 1, wherein the reader device comprises an information gathering device located on at least one of a wall, ceiling, or floor of the room.

10. The system according to claim 1, further comprising:
a robotic device having a movable arm and being configured to travel through the room, wherein the reader device is attached to the movable arm of the robotic device.

11. The system according to claim 1, wherein the means for identifying the locations of the identification devices comprises labels affixed at various positions of the room, said labels including indicia identifying the locations of the labels.

12. The system according to claim 1, wherein the means for identifying the locations of the identification devices comprises location aware devices configured to determine their locations with respect to other location aware devices and to a fixed reference point.

13. The system according to claim 1, wherein each of the plurality of identification devices further comprises respective input modules configured to enable receipt of the identification information of the respective associated components.

14. The system according to claim 13, wherein the input modules comprise infrared ports configured to enable receipt of the identification information from an electronic device through infrared communication.

15. The system according to claim 13, wherein the input modules enable the identification information to be received into the plurality of identification devices directly from the respective associated components.

16. The system according to claim 1, wherein each of the plurality of identification devices further comprise respective output modules configured to wirelessly transmit the identification information, wherein the reader device is further configured to receive the wirelessly transmitted identification information.

17. The system according to claim 1, wherein the reader device comprises an imaging device positioned on one of a ceiling and a wall of the room, wherein the imaging device is configured to obtain images of the plurality of identification devices, and wherein the means for identifying is further configured to read the identification information from the images of the plurality of the identification devices.

18. The system according to claim 17, wherein the imaging device is configured to simultaneously obtain images of a plurality of identification devices.

19. A system for managing inventory of components in a room, said system comprising:
- a plurality of identification devices affixed to respective associated components, said plurality of identification devices being configured to communicate identification information relating to the respective associated components;
- an imaging device positioned on one of a ceiling and a wall of the room, wherein the imaging device is configured to obtain images of the plurality of identification devices in a substantially autonomous manner to receive the identification information from the identification devices;
- means for identifying locations of the identification devices from reading the identification information contained in the images obtained by the imaging device; and
- a controller configured to communicate with the imaging device and compile the identification information received from the reader device and to communicate with the means for identifying the locations of the identification devices to maintain an inventory of the components and their respective locations.

20. The system according to claim 19, wherein the imaging device is configured to simultaneously obtain images of a plurality of identification devices.

21. The system according to claim 19, wherein the plurality of identification devices comprise respective digital displays configured to display the identification information.

22. The system according to claim 19, wherein each of the plurality of identification devices further comprise respective input modules configured to enable receipt of the identification information of the respective associated components.

23. The system according to claim 22, wherein the input modules comprise infrared ports configured to enable receipt of the identification information from an electronic device through infrared communication.

24. The system according to claim 22, wherein the input modules enable the identification information to be received into the plurality of identification devices directly from the respective associated components.

25. A system for managing inventory of components in a room, said system comprising:
- a plurality of identification devices affixed to respective associated components, said plurality of identification devices visually displaying location information pertaining to locations of the respective associated components;
- a reader device configured to substantially autonomously receive the location information from the identification devices through imaging of the visually displayed location information;
- means for identifying locations of the identification devices from the location information received by the reader device; and
- a controller configured to communicate with the reader device and compile the identification information received from the reader device and to communicate with the means for identifying the locations of the identification devices to maintain an inventory of the components and their respective locations.

26. The system according to claim 25, wherein the plurality of identification devices comprise respective digital displays configured to display the location information.

27. The system according to claim 25, wherein the reader device comprises at least one of an imaging device, an infrared reader, and an apparatus configured to wirelessly communicate with the identification devices.

28. The system according to claim 25, wherein each of the plurality of identification devices further comprises respective input modules configured to enable receipt of the identification information of the respective associated components.

29. The system according to claim 28, wherein the input modules comprise infrared ports configured to enable receipt of the identification information from an electronic device through infrared communication.

30. The system according to claim 28, wherein the input modules enable the identification information to be received into the plurality of identification devices directly from the respective associated components.

\* \* \* \* \*